(12) United States Patent
Nikitin et al.

(10) Patent No.: US 9,018,742 B2
(45) Date of Patent: Apr. 28, 2015

(54) ELECTRONIC DEVICE AND A METHOD FOR FABRICATING AN ELECTRONIC DEVICE

(75) Inventors: Ivan Nikitin, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 605 days.

(21) Appl. No.: 13/354,089

(22) Filed: Jan. 19, 2012

(65) Prior Publication Data

US 2013/0187259 A1    Jul. 25, 2013

(51) Int. Cl.
| H01L 23/495 | (2006.01) |
| H01L 23/528 | (2006.01) |
| H01L 23/532 | (2006.01) |
| H01L 21/60  | (2006.01) |
| H01L 23/31  | (2006.01) |
| H01L 23/00  | (2006.01) |

(52) U.S. Cl.
CPC ............ *H01L 23/3185* (2013.01); *H01L 24/32* (2013.01); *H01L 24/50* (2013.01); *H01L 24/86* (2013.01); *H01L 2224/32245* (2013.01); *H01L 2224/86203* (2013.01); *H01L 2224/86801* (2013.01); *H01L 2224/8685* (2013.01); *H01L 2924/00* (2013.01); *H01L 2924/00014* (2013.01); *H01L 2924/1305* (2013.01); *H01L 2924/13055* (2013.01); *H01L 2924/13091* (2013.01); *H01L 2924/1461* (2013.01)

(58) Field of Classification Search
None
See application file for complete search history.

(56) References Cited

U.S. PATENT DOCUMENTS

| 5,438,224 | A  | * | 8/1995  | Papageorge et al. | 257/777 |
| 5,530,282 | A  | * | 6/1996  | Tsuji             | 257/666 |
| 5,859,471 | A  | * | 1/1999  | Kuraishi et al.   | 257/666 |
| 6,165,817 | A  | * | 12/2000 | Akram et al.      | 438/118 |
| 6,682,954 | B1 | * | 1/2004  | Ma et al.         | 438/109 |
| 7,217,997 | B2 | * | 5/2007  | Wyland            | 257/707 |
| 2005/0006736 | A1 | * | 1/2005 | Williams         | 257/676 |
| 2007/0026631 | A1 | * | 2/2007 | Lin et al.       | 438/424 |
| 2010/0200978 | A1 |   | 8/2010 | Mengel et al.    |         |
| 2010/0207279 | A1 | * | 8/2010 | Law et al.       | 257/778 |

OTHER PUBLICATIONS

Johnson, P., et. al. "Selective Plating Equipment for Tape Automated Bonding Film (TAB film)", Proceedings of the 79th AESF Annual Technical Confrence Sur/Fin '92, Jun. 22-25, 1992.*

* cited by examiner

*Primary Examiner* — Joseph Schoenholtz
(74) *Attorney, Agent, or Firm* — Slater & Matsil, L.L.P.

(57) ABSTRACT

An electronic device includes a semiconductor chip. A contact element, an electrical connector, and a dielectric layer are disposed on a first surface of a conductive layer facing the semiconductor chip. A first conductive member is disposed in a first recess of the dielectric layer. The first conductive member electrically connects the contact element of the semiconductor chip with the conductive layer. A second conductive member is disposed in a second recess of the dielectric layer. The second conductive member electrically connects the conductive layer with the electrical connector.

29 Claims, 8 Drawing Sheets

ELECTRONIC DEVICE AND A METHOD FOR FABRICATING AN ELECTRONIC DEVICE

TECHNICAL FIELD

The present invention relates to an electronic device and a method for fabricating an electronic device.

BACKGROUND

A semiconductor chip can have contact elements on only one main surface or on both main surfaces thereof. The chip can be arranged in an electronic device which is to be constructed so that it can be arranged on an electronic board such as, for example, a printed circuit board (PCB). Therefore, the contact elements of the semiconductor chip have to be connected with electrical connectors of the electronic device which can be used to fix the electronic device on the electronic board.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
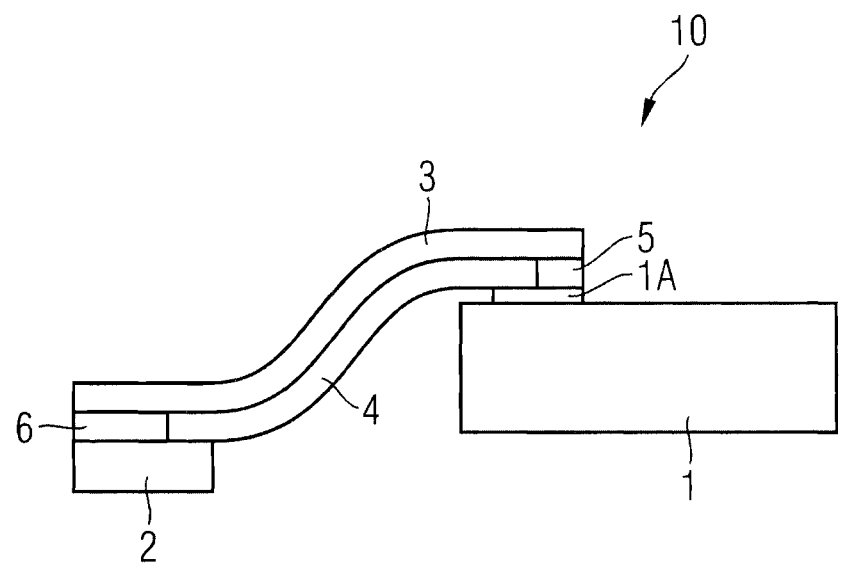
FIG. 1 shows a schematic cross-sectional side view representation of an exemplary electronic device according to the disclosure.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and a method for fabricating an electronic device may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures such as, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments, layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole such as, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

The contact elements of the semiconductor chip may also comprise a diffusion barrier. The diffusion barrier prevents in case of diffusion soldering that the solder material diffuses from the carrier in the semiconductor chip. A thin titanium layer on the contact element may, for example, effect such a diffusion barrier.

In the claims and in the following description different embodiments of a method for fabricating an electronic device are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

The electronic device as described in this application may comprise a carrier. The carrier may comprise or consist of any sort of electrically conducting material as, for example, copper or copper alloy or iron/nickel alloy. The carrier can be connected mechanically and electrically with one contact element of the semiconductor chip. The semiconductor chip can be connected to the carrier by one or more of re-flow soldering, vacuum soldering, diffusion soldering, or adhering by means of a conductive adhesive. If diffusion soldering is used as the connection technology between the semiconductor chip and the carrier, solder materials can be used which result in inter-metallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip is to be adhered to the carrier, conductive adhesives can be used. The adhesives can, for example, be based on epoxy resins which can be enriched with particles of gold, silver, nickel or copper to enhance their electrical conductivity.

Referring to FIG. 1, there is shown a schematic cross-sectional side view representation of an electronic device according to a first aspect. The electronic device 10 according to FIG. 1 comprises a semiconductor chip 1 comprising a contact element 1A, an electrical connector 2, a conductive layer 3, and a dielectric layer 4 disposed on a first surface of the conductive layer 3 facing the semiconductor chip 1. The electronic device 10 further comprises a first conductive member 5 disposed in a first recess of the dielectric layer 4, the first conductive member 5 electrically connecting the contact element 1A of the semiconductor chip 1 with the conductive layer 3 and a second conductive member 6 disposed in a second recess of the dielectric layer 4, the second conductive member 6 electrically connecting the conductive layer 3 with the electrical connector 2.

The electronic device 10 may further comprise a carrier, the semiconductor chip 1 being disposed above or on the carrier. The carrier may be arranged coplanar with the electrical connector 2. In particular, an upper surface of the carrier may be coplanar with an upper surface of the electrical connector 2, and a lower surface of the carrier may be coplanar with a lower surface of the electrical connector 2. This can be the case, for example, if the carrier and the electrical connector 2 originate from one and the same leadframe wherein the leadframe can be any sort of conventional leadframe, in particular copper-based leadframe. A more specific embodiment will be shown and explained later on.

A portion of the dielectric layer 4 of the electronic device 10 can be disposed on a portion of a surface of the carrier. This will be shown and explained in more detail later.

The carrier and the electrical connector 2 of the electronic device 10 can be fabricated of one and the same base material.

The electronic device 10 may further comprise a hollow space between the dielectric layer 4 and a side face of the semiconductor chip 1.

The dielectric layer 4 of the electronic device 10 may be disposed on a side face of the semiconductor chip 1.

The dielectric layer 4 of the electronic device 10 may be disposed on a side face of the electrical connector 2.

The dielectric layer 4 of the electronic device 10 may be disposed in an intermediate space between the electrical connector 2 and the carrier.

The electronic device 10 may further comprise a carrier layer, in particular a polymer-based layer disposed on a second surface of the conductive layer 3, the second surface being opposite to the first surface. As will be shown in some more detail later, the polymer-based layer may be used as a carrier layer in the fabrication process and the carrier layer can be left behind after finishing the fabrication process. The polymer-based layer may comprise a thickness in a range from 50 µm to 500 µm.

The conductive layer 3 of the electronic device 10 may comprise a first partial layer and a second partial layer, the second partial layer being deposited on the first partial layer, in particular being galvanically deposited on the first partial layer. According to this example which will also be shown later in more detail, such an example of an electronic device can be fabricated such that a carrier layer is removed from the conductive layer and thereafter an additional conductive layer is deposited or grown on the original conductive layer so that the resulting conductive layer comprises a reduced thermal and electrical resistance. The original conductive layer, i.e., the first partial layer, can be comprised of a metal foil, for example, a copper foil, and the second partial layer can be fabricated by galvanically depositing a further copper layer onto the first partial layer.

The first conductive member and the second conductive member of the electronic device 10 may be comprised of one and the same conductive material. In particular, the material of one or more of the first conductive member and the second conductive member may be different from the material of the conductive layer 3 or the electrical connector 2.

One or more of the first conductive member and the second conductive member of the electronic device 10 may comprise or consist of one or more of a material containing conductive particles, in particular nanoscopic particles, a soft solder, a diffusion solder, or an adhesive.

The thickness of the conductive layer 3 of the electronic device 10 may be in a range from 10 µm to 200 µm.

The contact element of the electronic device 10 may be arranged on a first main face of the semiconductor chip and on one and the same first main face a further contact element may be arranged. Such a further contact element can be connected to a further electrical connector in the same way as the first contact element, namely by use of a further conductive layer. The further electrical connector can also be fabricated from one and the same leadframe as was the case with the first electrical connector and the carrier. Further features, such as those described in connection with the first contact element, can also be utilized in connection with the further contact element.

The contact element of the electronic device 10 can be arranged on a first main face of the semiconductor chip 1 and a further contact element can be arranged on a second main face of the semiconductor chip 1 which is opposite to the first main face. With this further contact element on the second main face the semiconductor chip 1 can be electrically connected with a conductive carrier or base plate such as that of a leadframe. The semiconductor chip 1 of the electronic device 10 can have a vertical transistor structure comprising, for example, a source contact element and a gate contact element on a first, upper main face and a drain contact element on a second, lower main face of the semiconductor chip 1.

The electronic device 10 may further comprise a further dielectric layer disposed on a surface of the conductive layer remote from the semiconductor chip. A further conductive layer can be disposed on a surface of this further dielectric layer remote from the semiconductor chip. This further conductive layer can be used to make contact with a further contact element of the semiconductor chip via an electrical through-connection through the further dielectric layer. The further conductive layer can be electrically connected to a further electrical connector. A detailed example thereof will be shown and explained later.

According to a second aspect, an electronic device comprises a carrier, an electrical connector, a semiconductor chip comprising a contact element, the semiconductor chip disposed above the carrier, a conductive layer electrically connecting the contact element of the semiconductor chip with the electrical connector, and a dielectric layer disposed on a first surface of the conductive layer facing the semiconductor chip.

The electronic device of the second aspect may further comprise a first conductive member electrically connecting the contact element of the semiconductor chip with the conductive layer, and a second conductive member electrically connecting the conductive layer with the electrical connector. One or more of the first or second conductive members may comprise or consist of one or more of a material containing conductive particles, in particular nanoscopic particles, a soft solder, a diffusion solder, or an adhesive.

The electronic device of the second aspect may further comprise a carrier layer disposed on the conductive layer, wherein the carrier layer can be comprised of a polymer-based layer, in particular a polymer-based foil. A thickness of the carrier layer can be in a range from 50 µm to 500 µm. The carrier layer may comprise a thickness greater than a thickness of the conductive layer.

The conductive layer of the electronic device of the second aspect may comprise a thickness in a range from 10 µm to 100 µm.

The conductive layer of the electronic device of the second aspect may comprise a first partial layer and a second partial layer, the second partial layer being deposited on the first partial layer, in particular being galvanically deposited on the first partial layer, for example, in the same way as explained above in connection with the electronic device of the first aspect.

The carrier of the electronic device of the second aspect can be arranged coplanar with the electrical connector. A first upper surface of the carrier may be coplanar with a first upper surface of the electrical connector, and a second lower surface of the carrier may be coplanar with a second lower surface of the electrical connector. The carrier and the electrical connector can be fabricated from one and the same material and, in particular, the carrier and the electrical connector may originate from one and the same leadframe in a fabrication process.

A portion of the dielectric layer of the electronic device of the second aspect can be disposed on a portion of a surface of the carrier facing the semiconductor chip.

The electronic device of the second aspect may further comprise a hollow space between the dielectric layer and a side face of the semiconductor chip.

The dielectric layer of the electronic device of the second aspect can be disposed on a side face of the semiconductor chip.

The dielectric layer of the electronic device of the second aspect can be disposed on a side face of the electrical connector.

The dielectric layer of the electronic device of the second aspect may be disposed in an intermediate space between the electrical connector and the carrier.

Further examples of the electronic device according to the second aspect can be formed together with any one of the features and examples as described above in connection with the electronic device of the first aspect.

Figure 2A:
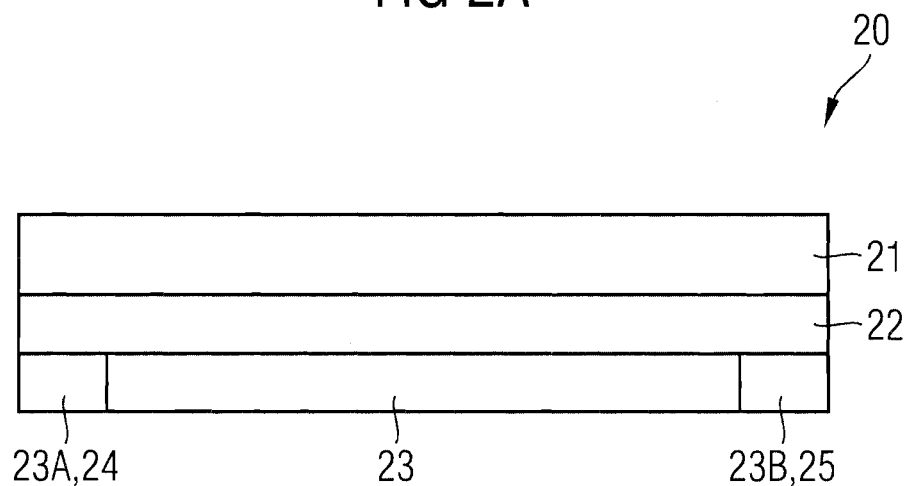
FIGS. 2A and 2B show schematic cross-sectional side view representations of exemplary flexible layer structures according to the disclosure.
Figure 2B:
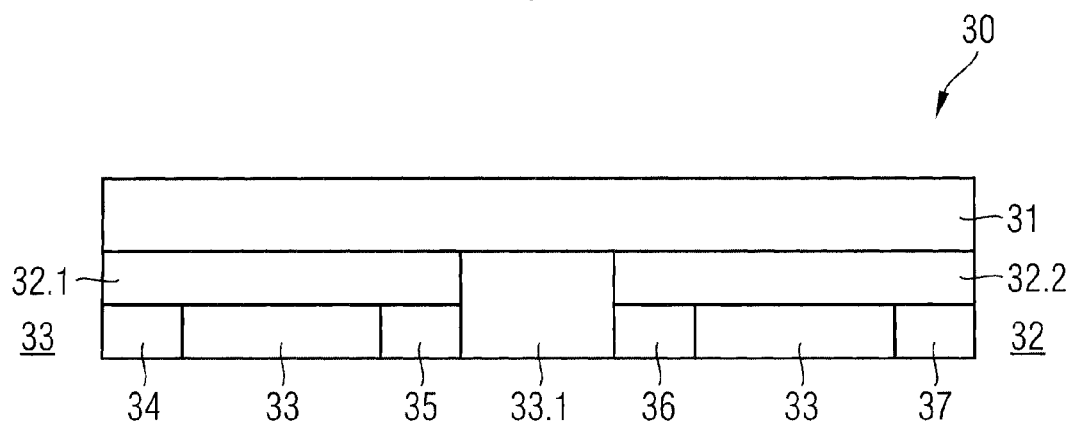
Figure 11:
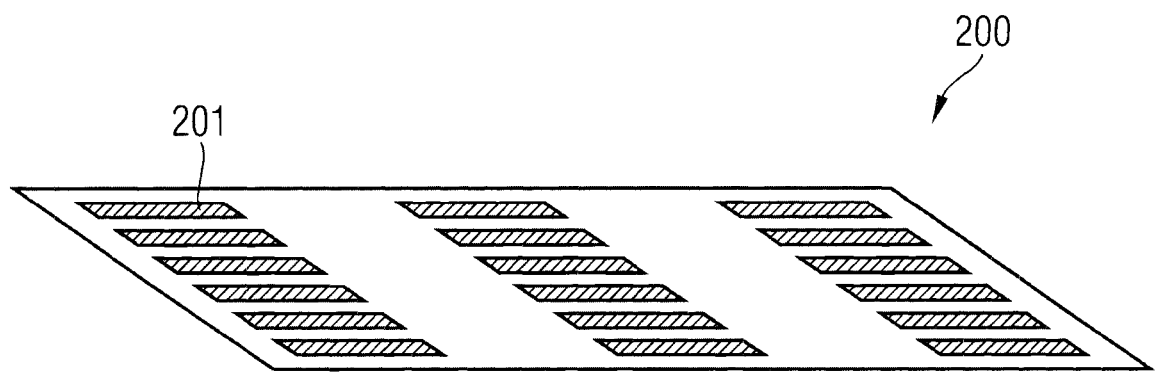
FIG. 11 shows a perspective view representation for illustrating an exemplary method for fabricating a flexible layer structure according to the disclosure.

Referring to FIGS. 2A, 2B, there are shown schematic cross-sectional side view representations of an exemplary flexible layer structure according to the disclosure. The flexible layer structure 20 of FIG. 2A comprises a carrier layer 21 which is preferably fabricated of a polymer-based foil which can have a thickness of up to 500 µm. On the carrier layer 21 a conductive layer 22, in particular a copper foil is laminated by, for example, pressing in an elevated temperature atmosphere. The copper foil can have a thickness of less than 100 µm, in particular 10 µm to 100 µm. On the other surface of the copper foil 22 a dielectric layer 23 is deposited which can have a thickness of less than 20 µm, in particular 5 µm to 20 µm. The dielectric layer 23 comprises a first recess 23A and a second recess 23B and thereafter a conductive medium like, for example, a material containing conductive particles, in particular silver nanoscopic particles, a soft solder, a diffusion solder, or an adhesive is filled in the first and second recesses 23A and 23B by means of screen printing, ink-jetting or dispensing. Thereafter, the thus fabricated first and second conductive members 24 and 25 are cured by, for example, the B-stage method. The flexible layer structure, as shown in FIG. 2A, can preferably be fabricated in a parallel process as indicated in FIG. 11. FIG. 11 shows a perspective view on a large layer structure 200 comprised of an upper polymer foil on a lower copper foil in which a plurality of strip-like copper foil contact elements 201 are fabricated. Recess areas are formed at the ends of the strip-like uppermost dielectric layer portions and by any one of the methods as mentioned before a conductive material is dispensed into the recess areas.

Referring to FIG. 2B, a flexible layer structure 30 is shown which essentially comprises the same structure as the flexible layer structure 20 of FIG. 2A. The layer structure 30 also comprises a polymer carrier foil 31, a copper foil 32, and a dielectric layer 33. The essential difference is that the layer structure 30 comprises two separate conductive layers 32.1 and 32.2 which are intended to be used in an embodiment of an electronic device such as that shown in FIG. 5, where a first contact element of the semiconductor chip is to be connected to a first electrical connector and a second contact element of the semiconductor chip is to be connected with a second electrical connector. For this purpose the layer structure 30 also comprises a first conductive member 34, a second conductive member 35, a third conductive member 36, and a fourth conductive member 37, all formed in respective recesses of the dielectric layer 33. The two conductive layers 32.1 and 32.2 are separated from each other by an elevated portion 33.1 of the dielectric layer 33.

Figure 3:
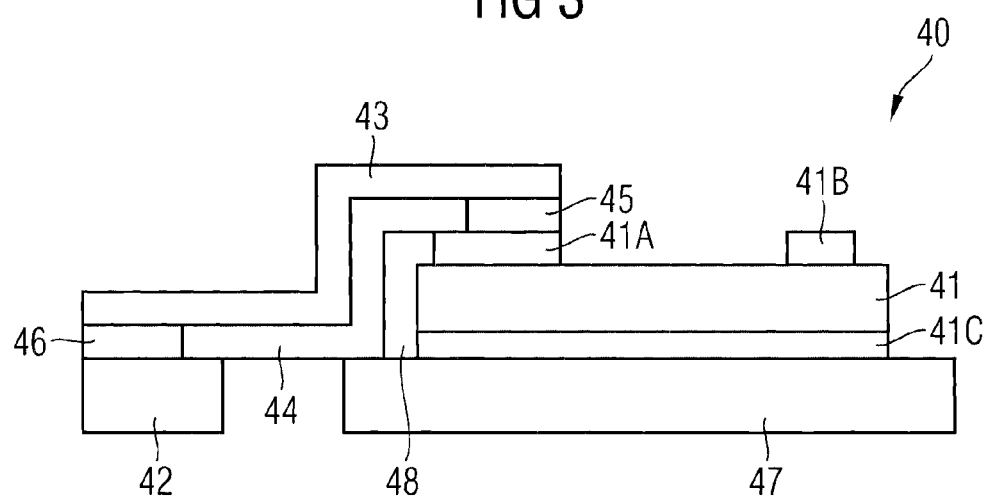
FIG. 3 shows a schematic cross-sectional side view representation of an exemplary electronic device according to the disclosure.

Referring to FIG. 3, there is shown a schematic cross-sectional side view representation of an exemplary electronic device according to the disclosure. The electronic device 40 comprises a semiconductor chip 41 which can be, for example, a chip comprising a vertical transistor structure. The semiconductor chip 41 comprises a first contact element 41A, which can be a source contact element, and a second contact element 41B, which can be a gate contact element, and a third contact element 41C, which can be a drain contact element. The semiconductor chip 41 is attached with its third contact element 41C on a base plate (carrier) 47 of a leadframe. The electronic device 40 further comprises an electrical connector 42 which originates from one and the same leadframe as the base plate 47. The electronic device 40 further comprises a copper foil 43 which electrically connects the first contact element 41A with the electrical connector 42 by means of a first conductive member 45 and a second conductive member 46. The first conductive member 45 electrically connects the first contact element 41A with the copper foil 43 and the second conductive member 46 electrically connects the copper foil 43 with the electrical connector 42. The first and second conductive members 45 and 46 can be fabricated of a silver nano-paste, a soft solder, a diffusion solder or an electrically conductive adhesive, all of which preferably hardened or cured so that it cannot react with anyone of the adjoining materials. The electronic device 40 further comprises a dielectric layer 44 connected with the copper foil 43.

The layer structure comprising the copper foil 43 and the dielectric layer 44 and the first and second conductive members 45 and 46 correspond to the layer structure as shown in FIG. 2A after the removing of the polymer carrier layer 21. One essential problem is that the upper surface of the first contact element 41A and the upper surface of the electrical connector 42 are situated in different planes which are parallel to each other. The lower surfaces of the first and second conductive members 45 and 46 have to be attached in a form-fitting manner to the upper surfaces of the first contact element 41A and the electrical connector 42. The problem is solved in that the layer structures, as shown in FIGS. 2A, 2B, are configured as flexible layer structures so that in a manner which will be shown later, the layer structure can be attached to the semiconductor chip 41 and the electrical connector 42 by, for example, first attaching the first conductive member 45 to the first contact element 41A in a form-fitting manner and then bending down the remaining part of the flexible layer structure for subsequently attaching the second conductive member 46 to the electrical connector 42 in a form-fitting manner. The result is that in the embodiment of FIG. 3 a hollow space 48 is created between the dielectric layer 44 and the left side face of the semiconductor chip 41. When bending down the flexible layer structure, a portion of the dielectric layer 44 can be placed on a left portion of an upper surface of the base plate 47. The electronic device 40 further can be encapsulated as usual by an encapsulation material so that only a portion of the electrical connector 42 and respective further electrical connectors are extending out of the encapsulation material to be connected to and fixed with an electronic board.

Figure 4:
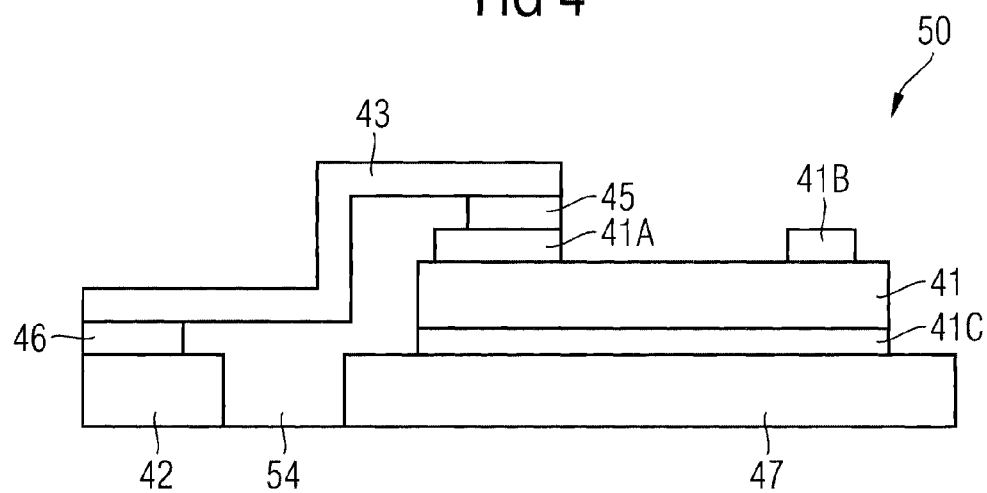
FIG. 4 shows a schematic cross-sectional side view representation of an exemplary electronic device according to the disclosure.

Referring to FIG. 4, there is shown a schematic cross-sectional side view representation of an exemplary electronic device according to the disclosure. In the following only differences with respect to the electronic device 40 of FIG. 3 will be explained. The same reference signs are used for elements having equal or similar structures and functions as in the electronic device 40 of FIG. 3. The only element which is structured differently is the dielectric layer 54. In the example of FIG. 4 the dielectric layer 54 is provided in the flexible layer structure in the form of a thermal set precursor and during attaching of the flexible layer structure to the semiconductor chip 41, the dielectric layer 54 liquefies and fills the hollow space to the left side face of the semiconductor chip 41 and also the hollow space between the electrical connector 42 and the base plate 47 before it reacts to its final state of a cured and hardened polymer network structure.

Figure 5:
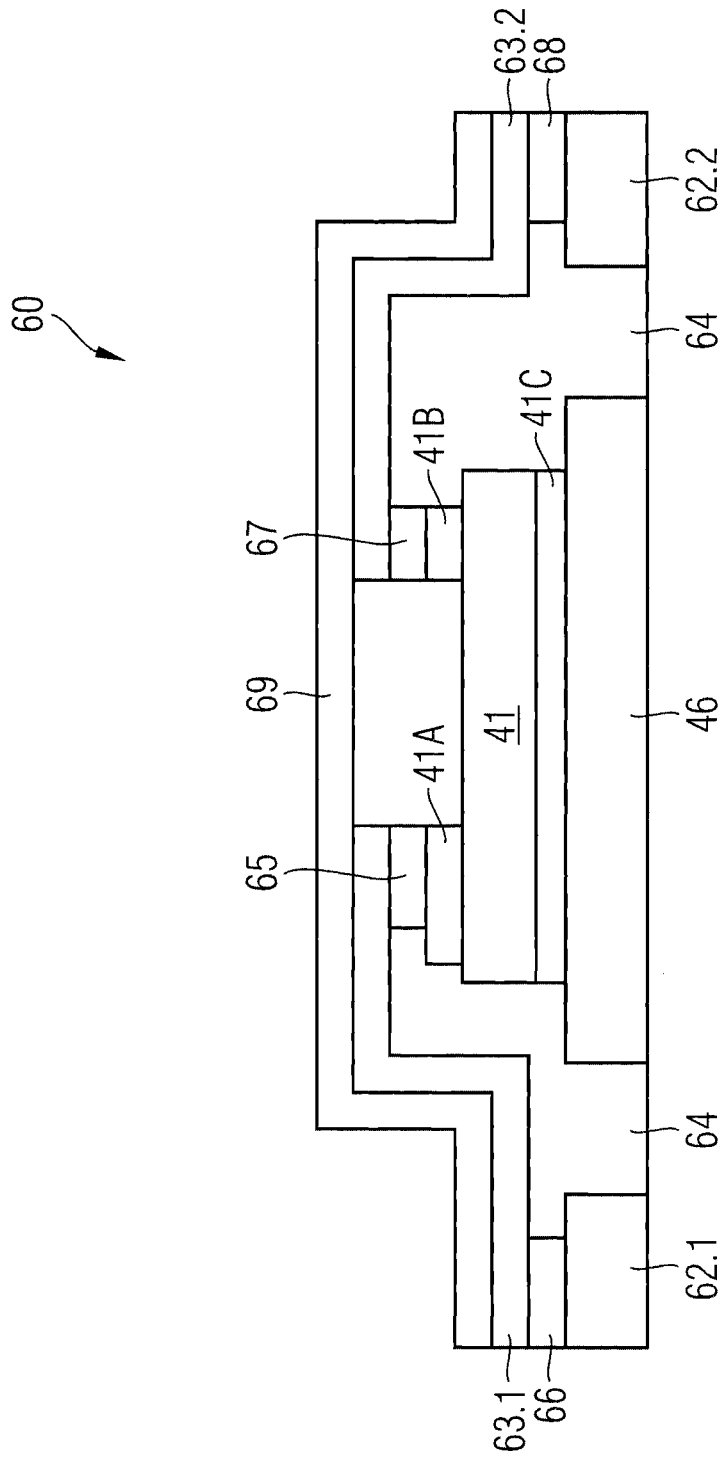
FIG. 5 shows a schematic cross-sectional side view representation of an exemplary electronic device according to the disclosure.

Referring to FIG. 5, there is shown a schematic cross-sectional side view representation of an exemplary electronic device according to the disclosure. Again only differences with respect to FIG. 4 are explained. The electronic device 60 comprises a first conductive layer 63.1 and a second conductive layer 63.2, a first electrical connector 62.1 and a second electrical connector 62.2 and a dielectric layer 64. The most important difference with respect to the electronic device 40 of FIG. 4 is that the first contact element 41A and the second contact element 41B of the semiconductor chip 41 are electrically connected to the first electrical connector 62.1 and the second electrical connector 62.2, respectively. For that purpose the electronic device 60 further comprises a first conductive member 65, a second conductive member 66, a third conductive member 67, and a fourth conductive member 68, for electrically connecting the first contact element 41A with the first electrical connector 62.1 and the second contact element 41B with the second electrical connector 62.2, respectively. Also with the embodiment of FIG. 5, the dielectric layer 64 is liquefied when attaching the flexible layer structure to the semiconductor chip 41 so that no hollow space is left within the inner structure of the electronic device 60. Furthermore, the carrier layer, i.e., the polymer foil 69 which corresponds to the polymer foil 31 of FIG. 2B, is left behind after finishing the fabrication of the electronic device 60.

Figure 6:
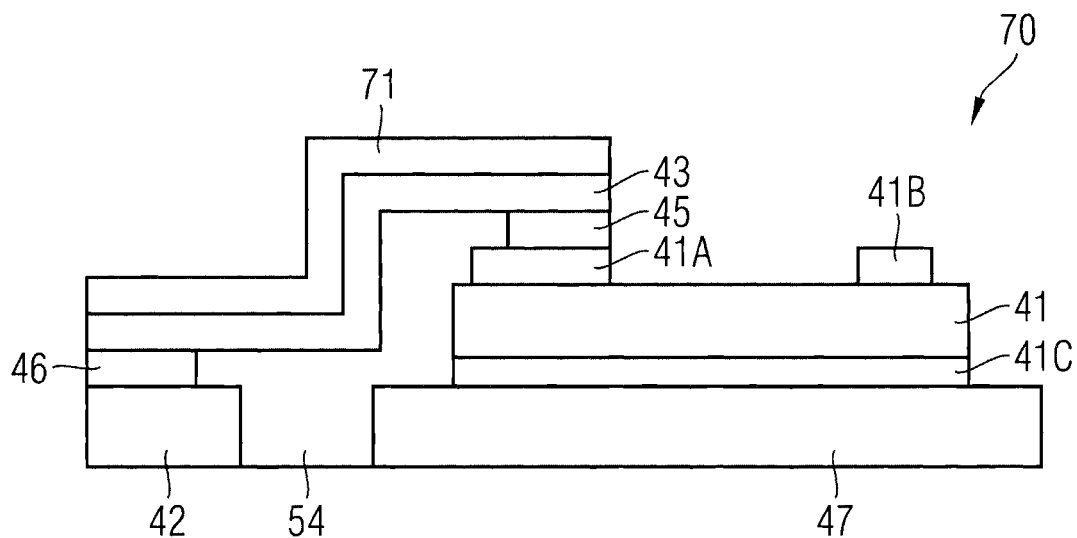
FIG. 6 shows a schematic cross-sectional side view representation of an exemplary electronic device according to the disclosure.

Referring to FIG. 6, there is shown a schematic cross-sectional side view representation of an exemplary electronic device according to the disclosure. The only difference between the electronic device 70 of FIG. 6 with the electronic device 50 of FIG. 4 is the fact that the carrier layer 71 is left in the product and not removed as in the other embodiments. The carrier layer 71, as explained before, can be fabricated of a flexible foil, preferably of a polymer-based foil like a polyimide foil. The thickness of the carrier layer 71 is preferably in a range between 50 μm to 500 μm.

Figure 7:
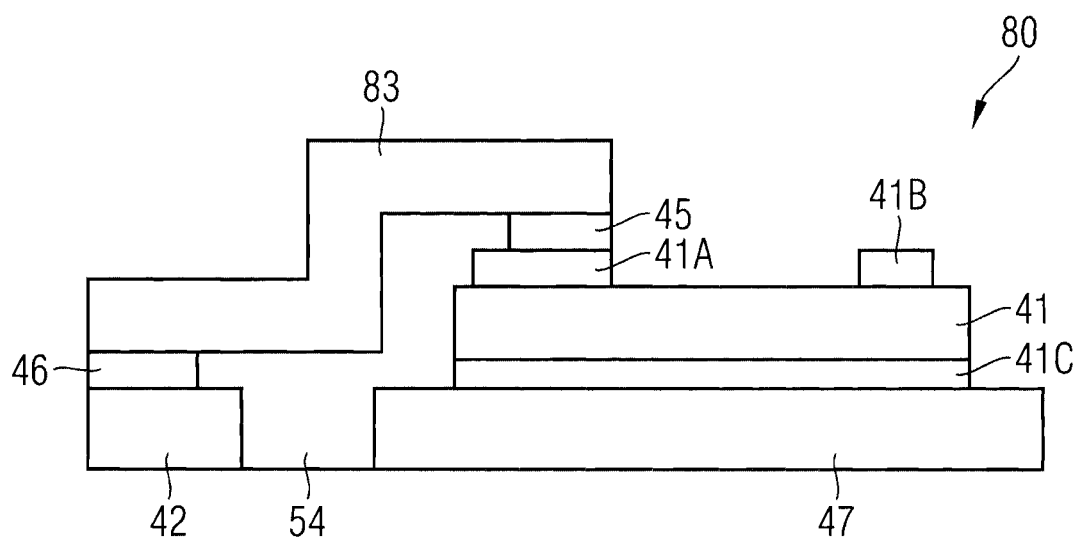
FIG. 7 shows a schematic cross-sectional side view representation of an exemplary electronic device according to the disclosure.

Referring to FIG. 7, there is shown a schematic cross-sectional side view representation of an exemplary electronic device according to the disclosure. The electronic device 80 of FIG. 7 differs from the electronic device 50 of FIG. 4 only in that the conductive layer 83 of the electronic device 80 is thicker than the conductive layer 43 of the electronic device 50. When fabricating the electronic device 80, the original conductive layer of the flexible layer structure may have had the same thickness as when fabricating the electronic device 50 of FIG. 4. However, thereafter the polymer carrier layer is removed and a further conductive layer is grown or deposited on the original conductive layer in order to fabricate a final conductive layer which has an increased thickness for lowering the thermal and electrical resistances. The growing or depositing of a further conductive layer can be, for example, performed by galvanically depositing a further metal layer onto the original metal layer. For example, the original metal layer can be a copper foil as described before. Onto this copper foil a further copper layer can be galvanically deposited.

Figure 8:
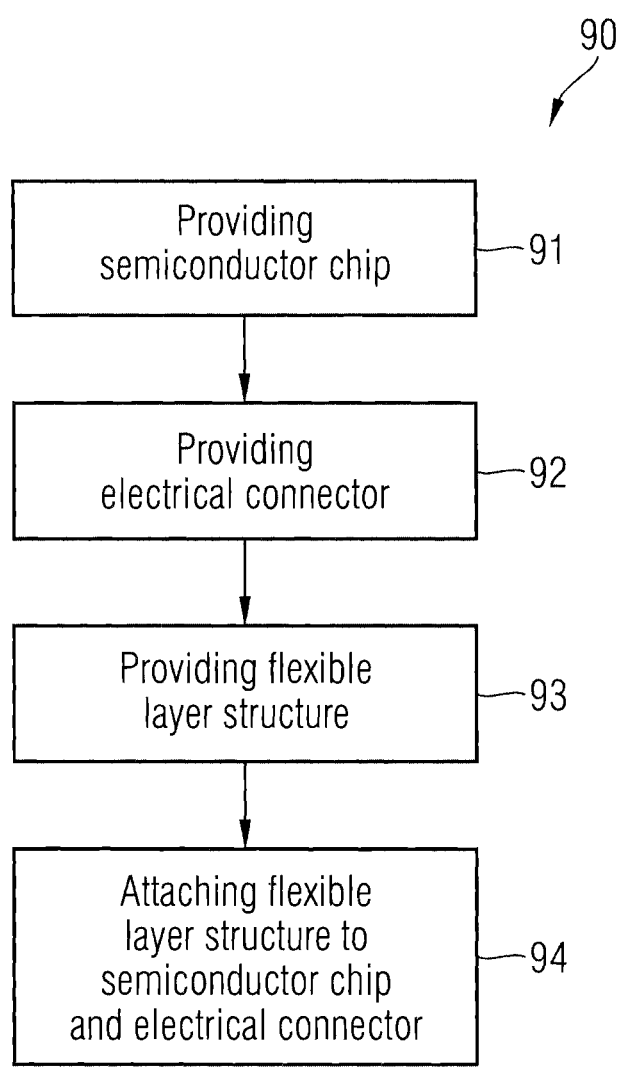
FIG. 8 shows a flow diagram for illustrating an exemplary method for fabricating an electronic device according to the disclosure.

Referring to FIG. 8, there is shown a flow diagram for illustrating an exemplary method for fabricating an electronic device according to the disclosure. The method 90 of FIG. 8 comprises providing a semiconductor chip comprising a contact element (91), providing an electrical connector (92), providing a flexible layer structure comprising a flexible carrier layer, a conductive layer disposed on the flexible carrier layer, a dielectric layer disposed on the conductive layer, and first and second conductive members disposed in respective first and second recesses of the dielectric layer (93), and attaching the flexible layer structure to the semiconductor chip and the electrical connector in such a way that the first conductive member is attached to the contact element of the semiconductor chip and the second conductive member is attached to the electrical connector (94).

The method 90 may further comprise attaching the semiconductor chip to a carrier.

Providing the flexible layer structure may comprise laminating a metal foil onto a flexible carrier layer, in particular a polymer-based foil like a polyimide foil.

Providing the flexible layer structure may comprise forming the first and second conductive members by filling a conductive material, in particular a material containing conductive particles, in particular nanoscopic particles, a soft solder, a diffusion solder, or an adhesive, into the first and second recesses, in particular by one or more of screen printing, ink-jetting or dispensing.

Providing the flexible layer structure may comprise fabricating a plurality of flexible layer structures in a parallel process.

Attaching the flexible layer structure to the semiconductor chip may comprise liquefying the dielectric layer so that it fills an intermediate base between the semiconductor chip, the electrical connector, and the conductive layer.

Attaching the flexible layer structure to the semiconductor chip may comprise bending the flexible layer structure so that the first and second conductive members are positioned in a form-fitting manner on the contact element and the electrical connector, respectively.

The method 90 may further comprise removing the flexible carrier layer after attaching the flexible layer structure to the semiconductor chip. The method may further comprise growing a further conductive layer onto the conductive layer, in particular by galvanical deposition.

Figure 9:
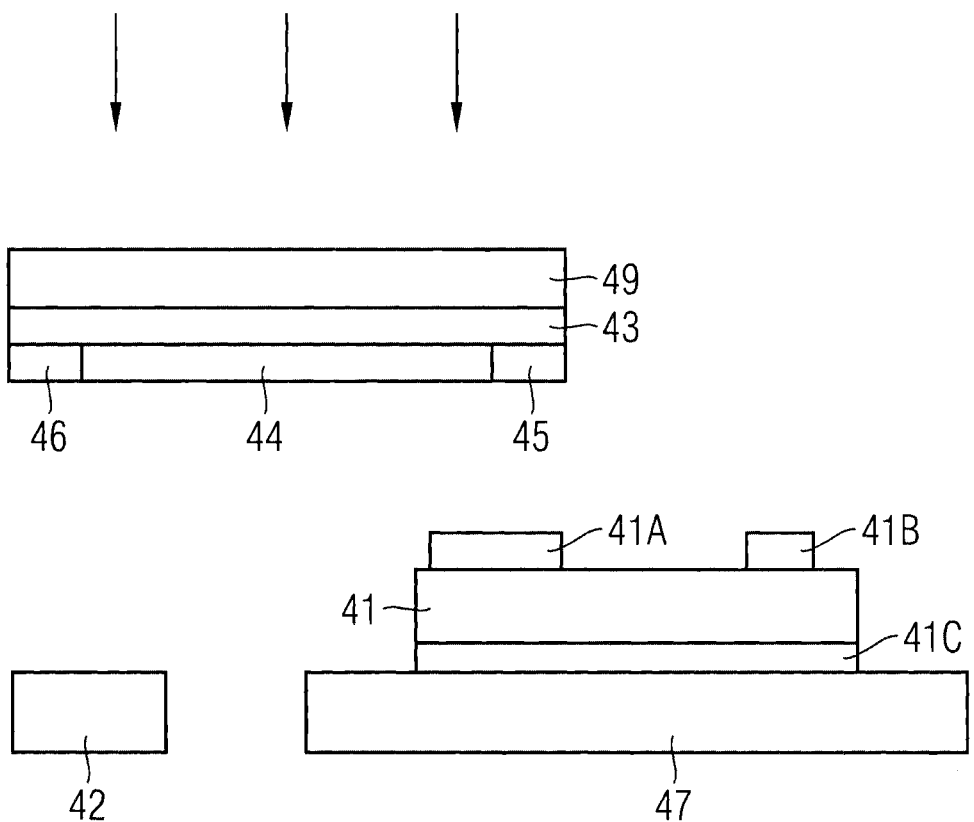
FIG. 9 shows a schematic cross-sectional side view representation for illustrating a step of an exemplary method for fabricating an electronic device according to the disclosure.

Referring to FIG. 9, there is shown a schematic cross-sectional side view representation for illustrating an example of the method. There is shown in the upper portion of FIG. 9 a flexible layer structure such as that described in connection with FIG. 2A comprising a polymer foil 49, a copper foil 43, a dielectric layer 44, and first and second conductive members 45 and 46. In the lower portion of FIG. 9 there is shown a semiconductor chip 41 attached to a carrier 47 and an electrical connector 42. FIG. 9 shows the step of attaching the flexible layer structure to the semiconductor chip and the electrical connector as indicated by the arrows. The method step is carried out in an atmosphere of elevated pressure and temperature. FIG. 9 also illustrates that the upper surface of the first contact element 41A and the upper surface of the electrical connector 42 are plane and lie in different planes which are parallel to each other. For attaching the first and second conductive members 45 and 46 in a form-fitting manner to the contact element 41A and the electrical connector 42, the flexible layer structure has to be moved downwards for attaching the first conductive member 45 to the first contact element 41A and then the left portion of the flexible layer structure has to be bent downwards in a way that the second conductive member 46 comes to rest on the electrical connector 42 in a way that the second conductive member 46 is also attached in a form-fitting manner on the electrical connector 42.

Figure 10A:
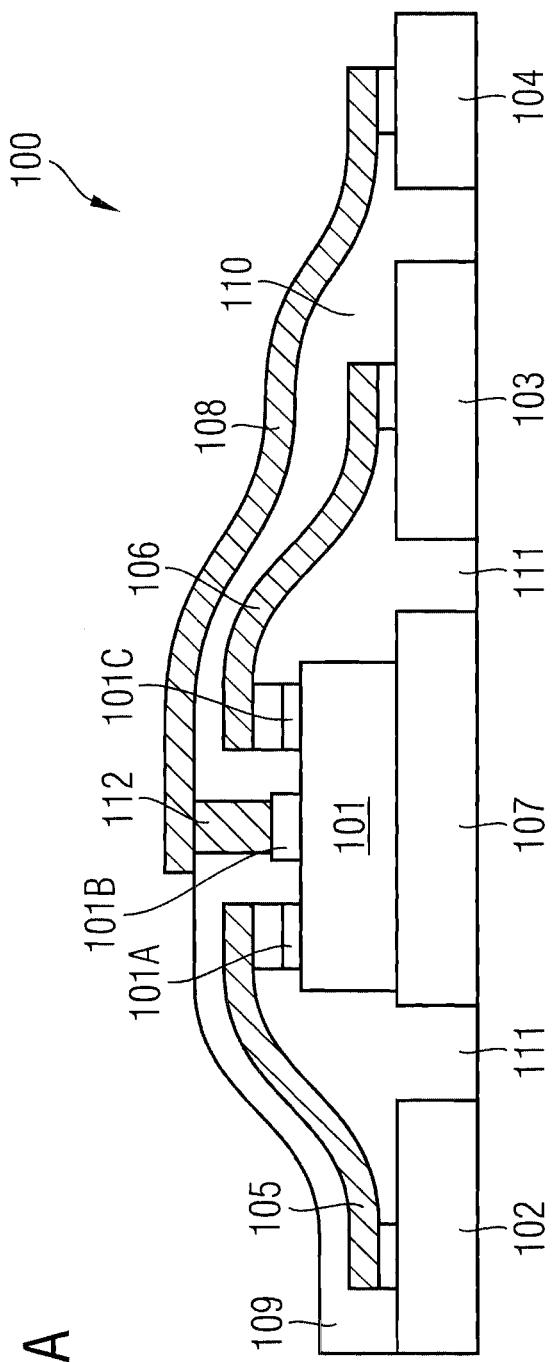
FIGS. 10A and 10B show a schematic cross-sectional side view representation (FIG. 10A) and a top view representation (FIG. 10B) of an exemplary electronic device according to the disclosure.
Figure 10B:
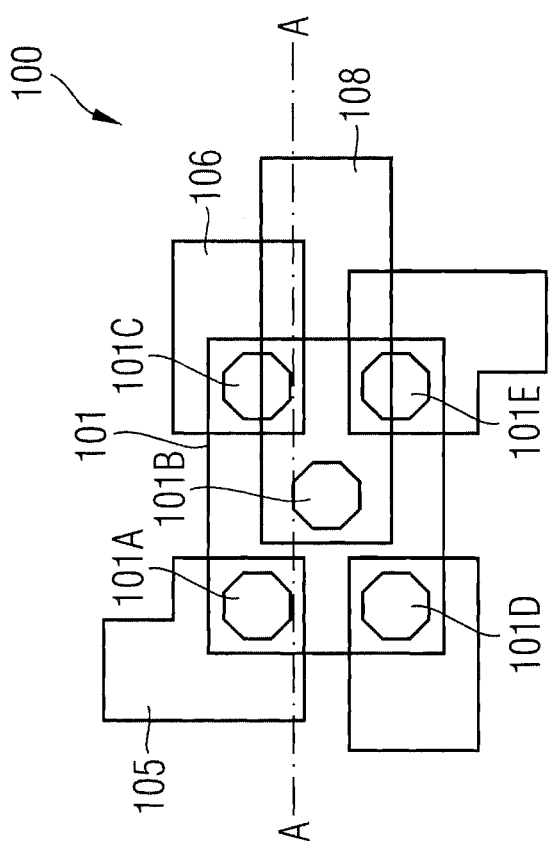

Referring to FIGS. 10A, 10B, there is shown a schematic cross-sectional side view representation (FIG. 10A) and a top view representation (FIG. 10B) of an exemplary electronic device 100 according to the disclosure. The cross-sectional representation of FIG. 10A is taken along line A-A of FIG. 10B. The electronic device 100 comprises a semiconductor chip 101 disposed on a carrier 107. In the plane of the carrier 107 electrical connectors 102, 103, and 104 are arranged. The electrical connectors 102, 103, 104, and the carrier 107 can be fabricated from one and the same leadframe. The semiconductor chip 101 comprises on an upper surface thereof a first electrical contact 101A, a second electrical contact 101B, and a third electrical contact 101C. The semiconductor chip 101 may comprise further electrical contacts 101D and 101E which are not shown in FIG. 10A but which can be seen in the top view representation of FIG. 10B. A first conductive layer 105 connects the first electrical contact 101A with a first electrical connector 102 in a way which was described in the previous examples of electronic devices, and in the same way a second conductive layer 106 connects the third electrical contact 101B with a second electrical connector 103. A dielectric layer 111 is disposed on lower surfaces of the conductive layers 105 and 106 wherein the dielectric layer 111 also covers side faces of the semiconductor chip 101. The electronic device 100 differs from the examples of electronic devices shown in FIGS. 1, 3 to 7 mainly in that a further dielectric layer 109 is disposed on upper surfaces of the first and second conductive layers 105 and 106. On an upper surface of the further dielectric layer 109 a further conductive layer 108 is disposed which connects the second electrical contact 101B with the third electrical connector 104. The second electrical contact 101B is connected with the further conductive layer 108 by an electrical through-connection 112 formed in a through-hole in the further dielectric layer 109. The through-connection 112 can be made of a metal and be formed by one and the same fabrication step as the further conductive layer 108. In FIG. 10B it can be seen that the further conductive layer 108 overlaps the second conductive layer 106. The further conductive layer 108 is connected with the third electrical connector 104 in the same way as the other conductive layers 105 and 106 are connected to the electrical connectors 102 and 103.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:
1. An electronic device, comprising:
a semiconductor chip comprising a contact element;
an electrical connector spaced from the semiconductor chip;
a conductive layer;
a dielectric layer disposed on a first surface of the conductive layer facing the semiconductor chip, wherein a portion of the dielectric layer is disposed on one or more of a side face of the semiconductor chip or a side face of the electrical connector;

a first conductive member disposed in a first recess of the dielectric layer, the first conductive member electrically connecting the contact element of the semiconductor chip with the conductive layer; and a second conductive member disposed in a second recess of the dielectric layer, the second conductive member electrically connecting the conductive layer with the electrical connector.

2. The electronic device according to claim 1, further comprising a carrier, the semiconductor chip being disposed above the carrier.

3. The electronic device according to claim 2, wherein the carrier is arranged coplanar with the electrical connector.

4. The electronic device according to claim 2, wherein a portion of the dielectric layer is disposed on a portion of a surface of the carrier facing the semiconductor chip.

5. The electronic device according to claim 2, wherein the dielectric layer is disposed in an intermediate space between the electrical connector and the carrier.

6. The electronic device according to claim 1, further comprising a polymer-based layer disposed on a second surface of the conductive layer, the second surface opposite to the first surface.

7. The electronic device according to claim 1, wherein the conductive layer comprises a first partial layer and a second partial layer, the second partial layer being deposited on the first partial layer.

8. The electronic device according to claim 2, wherein the carrier and the electrical connector are portions of a leadframe.

9. The electronic device according to claim 1, wherein one or more of the first or second conductive members comprise one or more of a material containing conductive particles, a soft solder, a diffusion solder, or an adhesive.

10. The electronic device according to claim 6, wherein the polymer-based layer comprises a polymer-based foil.

11. The electronic device according to claim 6, wherein the polymer-based layer has a thickness greater than a thickness of the conductive layer.

12. A method for fabricating an electronic device, comprising:
providing a semiconductor chip comprising a contact element;
providing an electrical connector;
providing a flexible layer structure comprising a flexible carrier layer, a conductive layer disposed on the flexible carrier layer, a dielectric layer disposed on the conductive layer, and first and second conductive members disposed in respective first and second recesses of the dielectric layer; and
attaching the flexible layer structure to the semiconductor chip and the electrical connector in such a way that the first conductive member is attached to the contact element of the semiconductor chip and the second conductive member is attached to the electrical connector, wherein providing the flexible layer structure comprises fabricating a plurality of flexible layer assemblies in a parallel process.

13. The method according to claim 12, further comprising attaching the semiconductor chip to a carrier.

14. The method according to claim 12, wherein providing the flexible layer structure comprises laminating a metal foil onto the flexible carrier layer.

15. The method according to claim 12, wherein providing the flexible layer structure comprises forming the first and second conductive members by filling a conductive material into the first and second recesses.

16. The method according to claim 15, wherein the conductive material comprises a material containing conductive particles, a soft solder, a diffusion solder, or an adhesive.

17. The method according to claim 15, wherein the filling comprises one or more of screen printing, ink-jetting, or dispensing.

18. The method according to claim 12, wherein attaching the flexible layer structure to the semiconductor chip comprises bending the flexible layer structure so that the first and second conductive members are positioned in a form-fitting manner on the contact element and the electrical connector, respectively.

19. The method according to claim 12, further comprising removing the flexible carrier layer after attaching the flexible layer structure to the semiconductor chip.

20. The method according to claim 19, further comprising growing a further conductive layer onto the conductive layer.

21. The method according to claim 19, further comprising growing a further conductive layer onto the conductive layer by galvanical deposition.

22. A method for fabricating an electronic device, comprising:
providing a semiconductor chip comprising a contact element;
providing an electrical connector;
providing a flexible layer structure comprising a flexible carrier layer, a conductive layer disposed on the flexible carrier layer, a dielectric layer disposed on the conductive layer, and first and second conductive members disposed in respective first and second recesses of the dielectric layer; and
attaching the flexible layer structure to the semiconductor chip and the electrical connector in such a way that the first conductive member is attached to the contact element of the semiconductor chip and the second conductive member is attached to the electrical connector, wherein attaching the flexible layer structure to the semiconductor chip comprises liquefying the dielectric layer so that it fills an intermediate space between the semiconductor chip, the electrical connector, and the conductive layer.

23. The method according to claim 22, further comprising attaching the semiconductor chip to a carrier.

24. The method according to claim 22, wherein providing the flexible layer structure comprises laminating a metal foil onto the flexible carrier layer.

25. The method according to claim 22, wherein providing the flexible layer structure comprises forming the first and second conductive members by filling a conductive material into the first and second recesses.

26. The method according to claim 25, wherein the conductive material comprises a material containing conductive particles, a soft solder, a diffusion solder, or an adhesive.

27. The method according to claim 22, wherein attaching the flexible layer structure to the semiconductor chip comprises bending the flexible layer structure so that the first and second conductive members are positioned in a form-fitting manner on the contact element and the electrical connector, respectively.

28. The method according to claim 22, further comprising removing the flexible carrier layer after attaching the flexible layer structure to the semiconductor chip.

29. The method according to claim 22, further comprising growing a further conductive layer onto the conductive layer.

* * * * *